United States Patent [19]

Shinnar

[11] Patent Number: 5,572,126
[45] Date of Patent: Nov. 5, 1996

[54] REDUCED POWER SELECTIVE EXCITATION RF PULSES

[75] Inventor: Meir Shinnar, Bala Cynwyd, Pa.

[73] Assignee: University of Pennsylvania, Philadelphia, Pa.

[21] Appl. No.: 282,220

[22] Filed: Jul. 28, 1994

[51] Int. Cl.$^6$ .................................. G01V 3/00; G01V 3/14
[52] U.S. Cl. .......................... 324/314; 324/307; 324/309
[58] Field of Search ..................................... 324/300, 307, 324/309, 311, 312, 314

[56] References Cited

U.S. PATENT DOCUMENTS

| 5,153,515 | 10/1992 | Leigh et al. | 324/307 |
| 5,280,245 | 1/1994 | Pauly | 324/307 |

OTHER PUBLICATIONS

J. W. Carlson, "Exact Solutions for Selective–Excitation Pulses", Journal of Magnetic Resonance 94, 1991, pp. 376–386.

S. Conolly, "Optimal Control Solutions to the Magnetic Resonance Selective Excitation Problem", IEEE Transactions on Medical Imaging, vol. MI–5, No. 2, Jun. 1986, pp. 106–115.

S. M. Eleff, "The Synthesis of Pulse Sequences Yielding Arbitrary Symmetric Magnetization Vectors", Journal of Magnetic Resonance 72, 1987, pp. 298–306.

S. D. McDonald, "Testing the Limits of Shape Optimization by Large–Flip–Angle Pulses" Journal of Magnetic Resonance 99, 1992, pp. 282–291.

J. Pauly, "Parameter Relations for the Shinnar–LeRoux Selective Excitation Pulse Design Algorithm", IEEE Transactions on Medical Imaging, vol. 10, No. 1, Mar. 1991, pp. 53–65.

D. E. Rourke, "The Inverse Scattering Transform and Its Use in the Exact Inversion of the Bloch Equation for Noninteracting Spins", Journal of Magnetic Resonance 99, 1992, pp. 118–138.

M. Shinnar, "Notes: Frequency Response of Soft Pulses", Journal of Magnetic Resonance 75, 1987, pp. 502–505.

M. Shinnar, "Inversion of the Bloch Equation", J. Chem. Phys., vol. 98, No. 8, Apr. 15, 1993, pp. 6121–6128.

M. Shinnar, "The Application of Spinors to Pulse Synthesis and Analysis", Magnetic Resonance in Medicine 12, 1989, pp. 93–98.

M. Shinnar, "The Synthesis of Soft Pulses with a Specified Frequency Response", Magnetic Resonance in Medicine 12, 1989, pp. 88–92.

M. Shinnar, "The Use of Finite Impulse Response Filters in Pulse Design", Magnetic Resonance in Medicine 12, 1989 pp. 81–87.

(List continued on next page.)

Primary Examiner—Sandra L. O'Shea
Assistant Examiner—Mack Haynes
Attorney, Agent, or Firm—Woodcock Washburn Kurtz Mackiewicz & Norris

[57] ABSTRACT

A technique has previously been described for generating optimal RF pulse sequences using finite impulse response filter techniques to calculate the Fourier series which would yield the desired z and xy magnetizations in a magnetic resonance imaging device. Such a technique is now extended to allow for control of the input pulse shape as well as the frequency response. Since the peak power is limited by the amplifier power and the total energy of the pulse is limited by the specific absorption rate (SAR) of the tissue or sample, it is desired to limit the peak power and total energy of the input pulse without degrading the resulting excitation. This is accomplished by recognizing that the total energy of the pulse is encoded in the lowest order Fourier series coefficients of the frequency response and then specifying the total energy of the pulse as a design parameter to the RF pulse synthesis algorithm. Peak power of the pulse may also be limited by selecting roots for $\beta(\omega)$, where $M_z(\omega)=|\alpha(\omega)|^2-|\beta(\omega)|^2$, which leads to pulses with variable phase yet do not change the overall frequency response. By appropriately selecting $\alpha(\omega)$ and $\beta(\omega)$, a hard pulse sequence is generated which serves as the basis for a shaped pulse which meets the desired constraints on the input pulse shape.

26 Claims, 5 Drawing Sheets

OTHER PUBLICATIONS

A. E. Yagle, "Inversion of the Bloch Transform in Magnetic Resonance Imaging Using Asymmetric Two–Component Inverse Scattering", Inverse Problems 6, 1990, pp. 133–151.

M. Shinnar, "The Synthesis of Pulse Sequences Yielding Arbitrary Magnetization Vectors", Magnetic Resonance in Medicine 12, 1989, pp. 74–80.

REDUCED POWER SELECTIVE EXCITATION RF PULSES

FIELD OF THE INVENTION

The present invention relates to novel methods of selectively exciting specified frequencies of magnetic resonance imaging systems. More specifically, the present invention relates to methods of synthesizing reduced power frequency selective radio frequency (RF) pulse sequences which generate desired frequency dependent excitations when applied to subjects in nuclear magnetic resonance (NMR) imaging systems yet do not exceed the peak power and total energy limitations on the input RF pulses.

BACKGROUND OF THE INVENTION

In magnetic resonance and optical spectroscopy, it is necessary to design pulses which will selectively excite only a part of the spectrum. There are several techniques for such selective excitation, including the technique described by the present inventor in U.S. Pat. No. 5,153,515, the contents of which are hereby incorporated by reference. In that patent, the present inventor disclosed a method of constructing selective excitations such as $\pi/2$, $\pi$ and refocusing pulse sequences for perturbing the spins of a magnetic resonance imaging system. In particular, the present inventor illustrated that the desired z magnetization, $M_z$, for a system starting at equilibrium ($M_z(\omega)=1$), can be written as an (N−1)th order Fourier series $\omega t$, where $\omega$ is the off-resonance frequency. In addition, if all pulses have the same phase, then the z magnetization is symmetric in frequency ($M_z(\omega)=M_z(-\omega)$), and can be written as an Nth order Fourier cosine series in $\omega t$. Then, the present inventor illustrated that, given a Fourier series or Fourier cosine series (in $\omega t$) representing the desired z magnetization, it is possible to perform an inversion of the nonlinear problem to determine a hard pulse sequence which will actually yield the desired response. The desired z magnetization was written as a Fourier series in $\omega t$ using finite impulse response filter theory so that hard pulse sequences could be generated which would yield an optimal frequency response when applied to the system. It was also illustrated that a soft pulse could be generated from the hard pulse sequence which would yield the same frequency response as the hard pulse sequence.

In the direct synthesis approach described in U.S. Pat. No. 5,153,515, one specifies the desired frequency spectrum and then synthesizes an RF pulse which will yield that desired response. Unfortunately, one has little control over the shape of the RF pulse which is actually applied to the system. However, in practice, it is necessary to limit the pulse shape. For example, the peak power (instantaneous power) of the applied pulse is limited by the transmitter power. Also, the total energy used by the pulse (i.e., the integral of the instantaneous power over the pulse duration) is limited by concerns for sample or tissue heating. In practice, the total energy deposited by the RF pulse is related to the specific absorption rate (SAR), which is limited by FDA guidelines. This limitation poses severe constraints on some fast imaging schemes. As a result, it is desired to develop a technique for the synthesis of reduced power pulses with a specified frequency profile within FDA guidelines yet which also may be used to generate the desired frequency response characteristics.

As noted in U.S. Pat. No. 5,153,515, the relationship between a radio frequency pulse and the frequency response of its effects on even a simple spin system is complex and nonlinear. The nonlinearity of this relationship has led to difficulties in the analysis and inversion of this relationship. However, over the last several years, many of these difficulties have been overcome. For example, given a desired frequency profile, the present inventor has proposed in U.S. Pat. No. 5,153,515 an algorithm which allows for the generation of pulses that will yield the desired response. Other systems for generating a desired frequency profile have also been proposed by Pauly et al. in an article entitled "Parameter Relations for the Shinnar-Le Roux Selective Excitation Pulse Design Algorithm," IEEE Trans. Med. Imag., Vol. 10, No. 1, pp. 53–65 (1991); Carlson in an article entitled "Exact Solutions for Selective-Excitation Pulses," J. Magn. Reson., Vol. 94, pp. 376–386 (1991); and Yagle in an article entitled "Inversion of the Bloch Transform in Magnetic Resonance Imaging Using Asymmetric Two-Component Inverse Scattering," Inverse Problems, Vol. 6, pp. 133–151 (1990). However, such algorithms offer only a partial solution in that there is still no illustration of the relationship between the details of the pulse shape and the frequency response. For example, if the pulse is restricted so that either the total energy or the peak power is bounded by a preset maximum, the limits this places on the possible frequency response have heretofore been unknown. Furthermore, outside of using a search algorithm such as that described by Conolly et al. in an article entitled "Optimal Control Solutions to the Magnetic Resonance Selective Excitation Problem," IEEE Trans. Med. Imaging, Vol. 5, No. 2, pp. 106–115 (1986), there is no known algorithm for incorporating constraints on the energy into the direct synthesis algorithms.

Recently, the present inventor obtained a partial solution to the relationship between a pulse and its frequency response. In particular, it was illustrated by Shinnar et al. in an article entitled "Inversion of the Bloch Equation," J. Chem. Phys., Vol. 98, pp. 6121–6128 (1993), that if pulses are restricted to be of finite time duration T, then the Fourier transform of the frequency response function is nonzero only over a finite period in the time domain. In other words, if the z magnetization, as a function of frequency $\omega$, is Fourier transformed back into the time domain s, it is zero for all $|s|>T$. Similar results have been obtained for all other functions which can be used to describe the frequency response. The present inventor further showed that one could not have a frequency response that had a sharper transition zone between excited and unexcited frequencies than the Fourier transform limit, 1/T. This solved the open problem about the limits achievable by RF pulses described by McDonald et al. in an article entitled "Testing the Limits of Shape Optimization by Large-Flip-Angle Pulses," J. Magn. Reson., Vol. 99, pp. 282–291 (1992).

Thus, if pulses are restricted to a finite time duration T, the Fourier transform of the frequency response of the RF pulse completely characterizes the space of magnetizations reachable with a finite duration RF pulse. In other words, not only must any magnetization profile achievable by a finite duration RF pulse satisfy this constraint, but also, for any magnetization function which satisfies this constraint, a finite duration pulse can be synthesized which yields the desired magnetization.

In practice, many other limitations on the pulse shape are useful. For example, the total energy and peak power used by a pulse are clearly of major significance because of sample heating and hardware limitations. As noted above, in clinical imaging, specific absorption rate (SAR) significantly limits some fast imaging schemes. Unfortunately, to date, there exists no theory or method known to the inventor for directly relating the energy of a pulse to the frequency response function. At present, one has to invert the Bloch equation and then calculate the energy. To the inventor's knowledge, no one has suggested calculating the energy requirement directly from the frequency response function.

It is thus desired to develop a technique which relates the energy requirement to the frequency response function so that the peak power of the synthesized "optimal" RF pulses can be reduced without any change in the excitation profile, time of the pulse, or the total energy of the pulse. Also, it is desired to develop a technique in which the total energy of the pulse is reduced as well. The method of the present invention has been developed for these purposes.

SUMMARY OF THE INVENTION

The above-mentioned needs in the prior art have been met by the present invention as a result of the present inventor's discovery of how the power requirements of the RF pulse are encoded in the frequency response of the RF pulse. As a result of this discovery, one merely needs to specify in the synthesis algorithm described in U.S. Pat. No. 5,153,515 the total amount of power so that a pulse can be synthesized with the desired power.

The present inventor has discovered that the total energy of the pulse is encoded in the lowest order Fourier coefficients of the frequency response and that this knowledge can be used in inverting the Bloch equation to yield selective RF pulses with reduced total energy. Reductions in total energy on the order of 10–20% have already been achieved using the techniques of the invention. In addition, modifications to the techniques disclosed in U.S. Pat. No. 5,153,515 have led to reductions in peak power on the order of 60–70% without changing the frequency response.

In a preferred embodiment of the invention, a method of generating a desired physically realizable, frequency dependent excitation of a system having predetermined constraints on its frequency response is described. Such a method in accordance with the invention preferably comprises the steps of:

(a) determining, as a function of frequency, an approximation to the desired frequency dependent excitation;

(b) specifying predetermined constraints on input pulses to the system which will yield the desired frequency dependent excitation;

(c) synthesizing a hard pulse sequence of N pulses which generates the approximation and which satisfies the predetermined constraints on the input pulses; and (d) applying the hard pulse sequence of N pulses synthesized in step (c) to the system.

In the preferred embodiment, the system is a nuclear magnetic resonance imaging system and the hard pulse sequence of N pulses is used to form an imaging slice for display. In NMR, the desired frequency dependent excitation is a magnetization applied to the system when the system is in an external $B_0$ magnetic field, and the desired frequency dependent excitation includes a rotation operator applied to perturb the system. The synthesized hard pulse sequence of N pulses is then used to refocus the imaging slice for display.

Typically, the predetermined constraints on the frequency response of the system include a maximum acceptable total energy and a reduction in maximum peak power of the hard pulse sequence. To accommodate such constraints, the synthesizing step (c) comprises the step of determining the constraints on the pulse profile of the approximation which yield the desired frequency dependent excitation yet satisfy the predetermined constraints on the input pulses to the system.

In the preferred embodiment, step (a) comprises the step of determining, as a function of frequency $\omega$, an approximation to a desired physically realizable magnetization $M_z$ in a direction z parallel to an external magnetic field B for the desired frequency dependent excitation of the system. Preferably, the desired frequency dependent excitation is described by a spinor of the form $(\alpha(\omega), \beta(\omega))$ where $M_z(\omega) = |\alpha(\omega)|^2 - |\alpha(\omega)|^2$, where $$\alpha(\omega) = \sum_{j=0}^{N} a_{N-2j} e^{\frac{i\pi(N-2j)\omega T}{N}}$$

and where $$\beta(\omega) = \sum_{j=0}^{N} b_{N-2j} e^{\frac{i\pi(N-2j)\omega T}{N}}$$

a and b being coefficients of the hard pulse sequence and T being a time duration of the hard pulse sequence.

The present inventor has discovered that the total energy $$E = \int_0^T |\omega_1^2| \, dt$$

for the hard pulse sequence applied to the system is proportional to a Fourier coefficient for $\alpha$, where the Fourier coefficient is defined as:

$$\frac{2N(1 - a_N)}{\pi^2 T}.$$

In synthesizing step (c), $\alpha(\omega)$ is synthesized using a minimum phase solution so that it is close to the desired frequency dependent excitation, subject to the constraint that $1 - a_N < (\pi^2 T^* E)/2N$, where E is the maximum acceptable total energy allowed for the hard pulse sequence.

On the other hand, the peak power may be reduced during synthesizing step (c) by solving for the roots of $\beta(\omega)^2$, where $|\beta(\omega)|^2 = 1 - |\alpha(\omega)|^2 = (1 - M_z(\omega))/2$, placing the roots of $|\beta(\omega)|^2$ in ordered pairs $(z, 1/z^*)$, where $|z| \geq 1$, and then either selecting z as a solution for $\beta(\omega)$ when $z_{imaginary} \geq 0$, selecting $1/z^*$ as a solution for $\beta(\omega)$ when $z_{imaginary} < 0$, selecting z as a solution for $\beta(\omega)$ when the $z_{imaginary} < 0$, or selecting $1/z^*$ as a solution for $\beta(\omega)$ when $z_{imaginary} > 0$. This approach leads to RF pulses with variable phase but less peak power. Since this calculation is independent of the determination of $\alpha(\omega)$, the same total energy results.

Of course, the technique of the invention is preferably used to generate "optimal" reduced power soft pulses. In such a case, the soft pulse is synthesized from the hard pulse sequence using the technique described in U.S. Pat. No. 5,153,515 so that the frequency dependent excitation of the system substantially corresponds to the frequency dependent excitation of the system when the hard pulse sequence is applied.

BRIEF DESCRIPTION OF THE DRAWINGS

The above and other objects and advantages of the invention will become more apparent to one skilled in the art in view of the accompanying drawings, of which.

DETAILED DESCRIPTION OF THE PREFERRED EMBODIMENT

Figure 1:
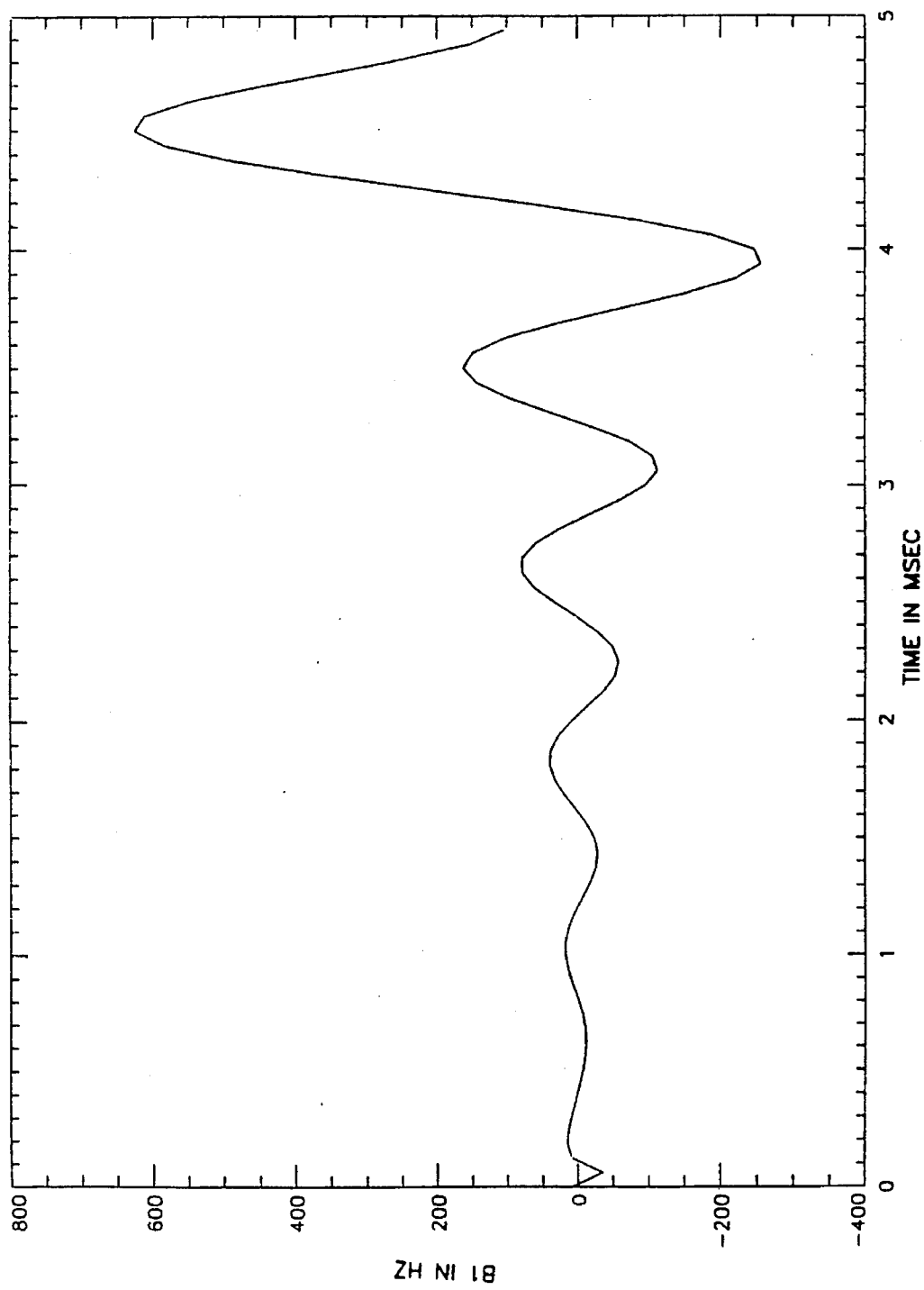
FIG. 1 illustrates a typical RF pulse synthesized in accordance with the invention.

A method in accordance with a presently preferred exemplary embodiment of the invention will be described below with reference to FIGS. 1–5. It will be appreciated by those of ordinary skill in the art that the description given herein with respect to those figures is for exemplary purposes only and is not intended in any way to limit the scope of the invention. All questions regarding the scope of the invention may be resolved by referring to the appended claims.

In U.S. Pat. No. 5,153,515, the present inventor described how to generate a $B_1$ profile which will give the desired excitation profile for NMR imaging and the like. In particular, a technique was described which allows an ideal pulse to be approximated as closely as possible. Tailored hard pulse sequences or soft pulse sequences were designed which excite a narrow bandwidth of resonant frequencies for clarity of imaging for better clinical diagnosis. The techniques described in that patent describe how to generate hard pulse sequences or soft pulses which achieve frequency responses as close as possible to the ideal or optimal pulse.

In accordance with the method described in U.S. Pat. No. 5,153,515, the contents of which were incorporated by reference above, one starts with a physically realizable z magnetization which may be achieved by a hard pulse sequence and then determines a hard pulse sequence which will actually yield that z magnetization. In particular, an N hard pulse sequence to be applied around the x axis within a total duration of T has a magnetization response $M_z$ which is written as a Fourier cosine series in which $|M_z(\omega)|$ is always less than or equal to one. Then, if a desired $M_z(\omega)$ is given, the equation for calculating $M_z(\omega)$ reduces to a phase retrieval or deconvolution problem in which $M_z(\omega)$ may be converted to a complex polynomial in $s=\exp(i\omega T/(N-1))$ and then solved for the roots of the polynomial $1-M_z^2(\omega)$, or equivalently, for the two polynomials $1-M_z(\omega)$ and $1+M_z(\omega)$. One then groups the roots of the polynomials by means of symmetry considerations and chooses half of them. There are also techniques such as cepstral deconvolution which allow for the solution of $M_{xy}(\omega)$ as an $(N-1)$ degree polynomial in s. This is a representation of $M_{xy}(\omega)$ as an $(N-1)$th degree complex Fourier series. As will be noted in more detail below, by representing these magnetization vectors as spinors and selecting different roots for the polynomials, constraints such as peak power and total energy over the pulse may be placed on the input pulses used to generate the desired frequency dependent excitation.

The next step in the process is to find a pulse sequence which will yield the Fourier series which will provide the desired magnetization. Generally, $M_z$ is a complex Fourier series. As noted in U.S. Pat. No. 5,153,515, the resulting problem is similar to a problem in digital filter design, namely, the design of finite impulse response filters. Using finite impulse response filter theory, a desired hard pulse sequence may be created by specifying the desired z magnetization, the number of pulses, and the duration of the pulse sequence. One then views $M_z$ as a Fourier series in $\omega T/(N-1)$ and uses a finite impulse response filter design technique to obtain a Fourier series which specifies $M_z$ as having certain desired values over certain specified ranges. One then normalizes the Fourier series obtained for $M_z$ so that it is always less than or equal to one in absolute value and then one uses the techniques described in U.S. Pat. No. 5,153,515 to synthesize the consistent $M_{xy}$ and a pulse sequence to actually generate that magnetization, $B_1$.

The present invention is an extension of the technique described in U.S. Pat. No. 5,153,515 in that now one may specify further constraints on the input pulses such as the maximum total energy over the pulse duration and/or that the peak power should be reduced. To explain how this may be accomplished in accordance with the present invention, the magnetization system will be described using the spinor formulation of the Bloch equation without relaxation. In this version of the formulation, a classical description of nuclear magnetic resonance is used in which the effect of being off resonance or of a radio frequency pulse is to induce a rotation.

A counterclockwise rotation of $\theta$ radians around an axis having directional cosines ($c_x$, $c_y$, $c_z$) can be written as the following complex unitary matrix:

$$\begin{matrix} \cos\left(\frac{\theta}{2}\right) - ic_z \sin\left(\frac{\theta}{2}\right) & (-c_x + ic_y)\sin\left(\frac{\theta}{2}\right) \\ (c_x + ic_y)\sin\left(\frac{\theta}{2}\right) & \cos\left(\frac{\theta}{2}\right) + ic_z \sin\left(\frac{\theta}{2}\right) \end{matrix} \quad \text{Equation 1}$$

This matrix can be represented by its first column ($\alpha$, $\beta$). Thus, free precession at a frequency $\omega$ Hz around the z axis for time T is represented by the spinor ($e^{-i\pi\omega T}$, 0).

The effect of a radio frequency pulse on a spin at frequency $\omega$ can be described by a spinor [$\alpha(\omega)$, $\beta(\omega)$]. When applied to a system at equilibrium ($M_z=1$), then the resultant magnetization can be written as:

$$M_z(\omega)=|\alpha(\omega)|^2-|\beta(\omega)|^2=2|\alpha(\omega)|^2-1=1-2|\beta(\omega)|^2 \quad \text{Equation 2}$$

$$M_{xy}(\omega)=M_x(\omega)+iM_y(\omega)=2i\alpha^*(\omega)\beta(\omega) \quad \text{Equation 3}$$

Thus, the frequency specification consists of specifying either $M_z(\omega)$, $M_{xy}(\omega)$, $\alpha(\omega)$, $\beta(\omega)$, or $\beta(\omega)/\alpha(\omega)$. The direct inversion method described in U.S. Pat. No. 5,153,515 proceeds by specifying one of these parameters, generating $\alpha(\omega)$ or $\beta(\omega)$ by using a consistency criterion and a phase retrieval algorithm, and then generating a RF pulse.

As noted in U.S. Pat. No. 5,153,515, each hard pulse can be considered to be a rotation around an axis in the xy plane, lasting for an infinitesimal time. The sequence consists of $(N+1)$ hard pulses, separated by time $T/N$, when the system precesses freely around the z axis. The total duration of the sequence is T. It was also shown that the spinor corresponding to such a pulse sequence can be written as:

$$\alpha(\omega) = \sum_{j=0}^{N} a_{N-2j} e^{\frac{i\pi(N-2j)\omega T}{N}} \quad \text{Equation 4}$$

$$\beta(\omega) = \sum_{j=0}^{N} b_{N-2j} e^{\frac{i\pi(N-2j)\omega T}{N}} \quad \text{Equation 5}$$

Using such notation, the spinor corresponding to a rotation by angle $\theta$ around an axis in the xy plane with phase $\theta$ is $[\cos(\theta/2), e^{i\theta}\sin(\theta/2)]$.

Over any bounded frequency range, the frequency response of any shaped pulse can be approximated to arbitrary accuracy by an N hard pulse sequence, for large N. Furthermore, the flip angles and phases of the hard pulses may be derived from the shaped pulse amplitude. In other words, if the shaped pulse is described by $\omega_1(t)$, where $\omega_1(t)$ is in radians/sec, then the jth hard pulse has amplitude $$\frac{|\omega_1(jT/N)|T}{N} \quad \text{Equation 6}$$

and phase $$\frac{\omega_1(jT/N)}{|\omega_1(jT/N)|} \quad \text{Equation 7}$$

Minimization of Total Pulse Energy

The present inventor has discovered that the total energy of the shaped pulse is encoded in one of the Fourier coefficients of $\alpha(\omega)$. If the total energy E of the shaped pulse lasting from time 0 to time T is defined as:

$$E = \int_0^T |\omega_1|^2 \, dt \quad \text{Equation 8}$$

where $|\omega_1(t)|$ is the amplitude (in Hz) of the radio frequency pulse, then using the notation of Equation 4, it can be shown that:

$$E \approx \frac{2N \log(a_N)}{\pi^2 T} \approx \frac{2N(1 - a_N)}{\pi^2 T} \quad \text{Equation 9}$$

The proof of this is relatively simple. In the hard pulse sequence:

$$a_N = \sum_{j=1}^{N} \cos\left(\frac{\theta_j}{2}\right) \quad \text{Equation 10}$$

For large N, a hard pulse sequence derived from a shaped pulse sequence has a small $\theta_j$ which can be written as (O(1/N)) using Landau's O notation. As a result, $$\cos\left(\frac{\theta_j}{2}\right) = 1 - \frac{\theta_j^2}{8} + O(1/N^4) \quad \text{Equation 11}$$

Taking the log of both sides of Equation 10, we get $$\log(a_n) = \sum_{j=1}^{N} \log\left(\cos\left(\frac{\theta_j}{2}\right)\right) = \quad \text{Equation 12}$$

$$\sum_{j=1}^{N} \log\left(1 - \frac{\theta_j^2}{8} + O(1/N^4)\right) = \left(-\sum_{j=1}^{N} \frac{\theta_j^2}{8}\right) + O(1/N^3)$$

Since the last term can be neglected, substituting for $\theta$, we get:

$$\log(a_N) = -\frac{1}{8} \sum_{j=1}^{N} \left(\frac{\omega_1\left(\frac{jt}{N}\right) 2\pi T}{N}\right)^2 = \quad \text{Equation 13}$$

$$-\sum_{j=1}^{N} \frac{\omega_1\left(\frac{jT}{N}\right)^2 \pi^2 T^2}{2N^2}$$

However, using a Riemann sum approximation for the integral defining the energy E, we get:

$$E = \sum_{j=1}^{N} \frac{\omega_1\left(\frac{jT}{N}\right)^2 T}{N} \quad \text{Equation 14}$$

Therefore:

$$E = -\frac{2N \log(a_N)}{\pi^2 T} \approx \frac{2N(1 - a_N)}{\pi^2 T} \quad \text{Equation 15}$$

which is the same as Equation 9.

The relationship of Equation 15 has a number of immediate consequences. First, it establishes that the total pulse energy is proportional to the Fourier coefficient, a, and that everything else relates to the shape of the pulse's profile. Second, for a hard pulse sequence derived from a shaped pulse, it establishes that $1-a_N$ is $O(1/N)$. This can serve as a rough check to see if N is large enough, which also implies that the proportionality is valid for large N. Third, if $\alpha(\omega)$ is specified, the total energy has also been specified. Therefore, all the RF pulses which can be generated with the same $\alpha(\omega)$ but different $\beta(\omega)$ will have the same energy.

In accordance with the invention, if only $M_z(\omega)$ is specified, then one has only specified $|\alpha(\omega)|^2$. Generally, $\alpha(\omega)$ is generated using a phase retrieval algorithm. Given a desired frequency response, it is known that one should choose the minimum phase solution for $\alpha(\omega)$ corresponding to all roots outside the unit circle in order to obtain the pulse with the least energy. For example, Pauly et al. teach in the aforementioned article entitled "Parameter Relations for the Shinnar-Le Roux Selective Excitation Pulse Design Algorithm", IEEE Trans. Med. Imaging, Vol. 10, No. 1, March 1991, that the minimum phase solution minimizes the power requirements. Indeed, Pauly et al. derive a similar equation for the total energy. However, Pauly et al. do not illustrate that the frequency response could be modified by choosing a different $\alpha(\omega)$. In other words, given $\alpha(\omega)$ with the same $|\alpha(\omega)|^2$, Pauly et al. demonstrated that the minimum phase $\alpha(\omega)$ was the minimum energy. However, the comparison of two different $\alpha(\omega)$ was not made by Pauly et al., and Pauly et al. did not suggest that such a consideration should be introduced into the pulse design protocol.

If $M_z(\omega)$ is symmetric (i.e., $M_z(\omega)=M_z(-\omega)$), then the minimum phase solution has all real coefficients. Therefore, a pulse with constant RF phase can be synthesized which has minimum energy. In other words, for symmetric $|\alpha(\omega)|^2$, one cannot reduce the energy requirements by using variable phase pulses. However, for this relationship to be valid, it is necessary that N be sufficiently large that approximations for the cosine of the flip angle are valid.

Figure 2:
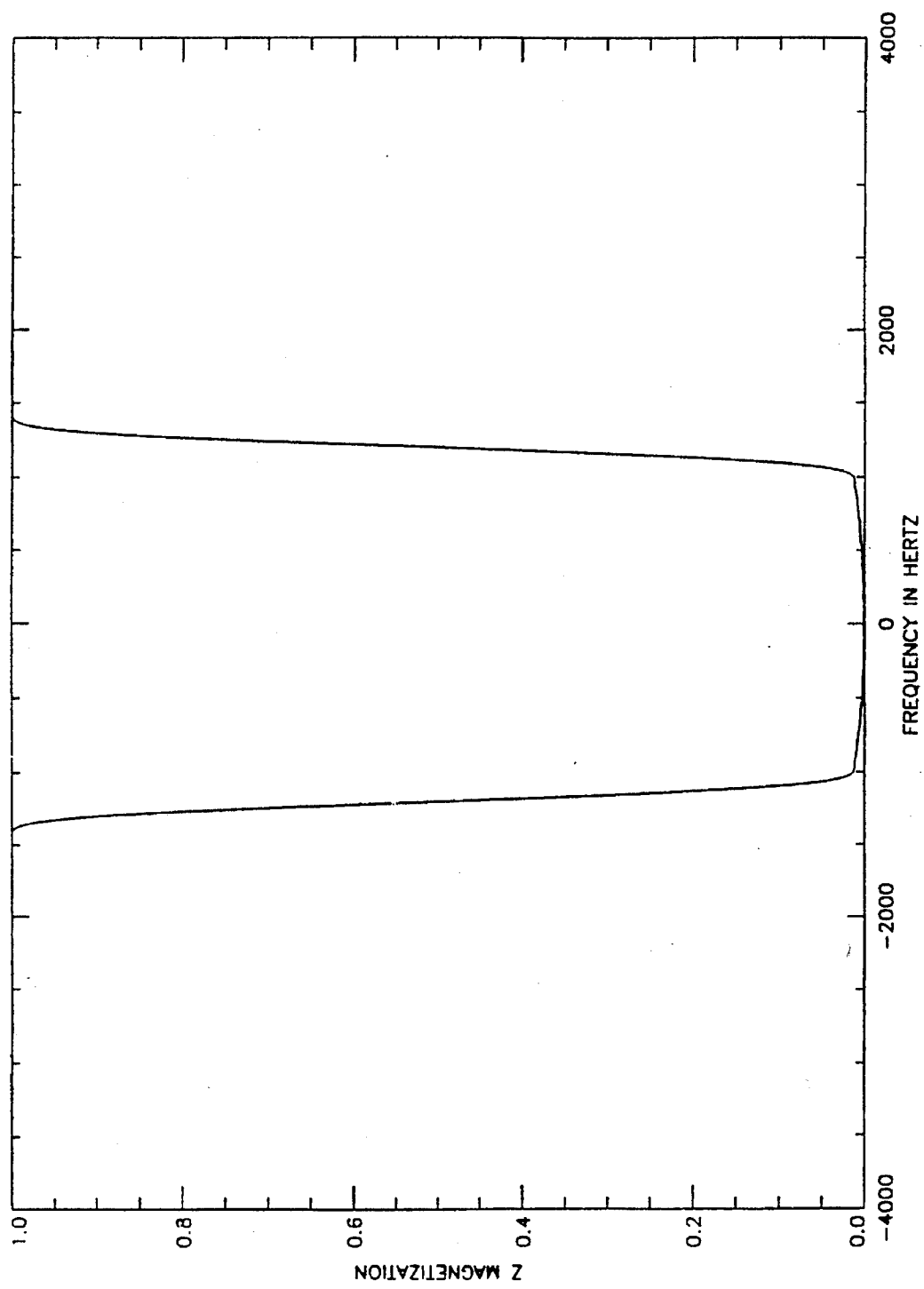
FIG. 2 illustrates the frequency response of the RF pulse of FIG. 1 where the z magnetization is normalized to be one at equilibrium.

To illustrate this, a series of pulses have been synthesized with different frequency responses. The energy of these pulses vary by a factor of almost 40. FIG. 1 shows the profile of the typical pulse, and FIG. 2 shows the frequency response caused by the pulse of FIG. 1 when applied to an MR imaging apparatus. In FIG. 2, the z magnetization is normalized to be 1 at equilibrium. Table 1 below lists the frequency characteristics resulting from the application of these pulses. In Table 1, shaped pulses lasting for 5 msec were synthesized to desired frequency requirements using N (column 1) hard pulses. From Table 1, it can be appreciated that as N becomes larger and the individual flip angles become smaller, the approximation becomes even more accurate.

TABLE 1

| NUMBER OF PULSES | EXCITATION ANGLE | WIDTH (± HZ) | ENERGY (FROM PULSE) | ENERGY (FROM EQUATION 15) | % ERROR |
|---|---|---|---|---|---|
| 40 | 90 | 500 | 96.1462 | 96.3247 | .186 |
| 40 | 90 | 1000 | 165.537 | 166.572 | .625 |
| 40 | 90 | 2000 | 301.328 | 307.025 | 1.891 |
| 80 | 90 | 500 | 96.3913 | 96.4867 | .099 |
| 80 | 90 | 1000 | 166.401 | 166.725 | .195 |
| 80 | 90 | 2000 | 305.921 | 307.148 | .401 |
| 80 | 180 | 500 | 988.438 | 999.140 | 1.083 |
| 80 | 180 | 1000 | 1822.55 | 1866.4 | 2.406 |
| 80 | 180 | 2000 | 3377.18 | 3636.91 | 7.691 |
| 120 | 180 | 2000 | 3515.5 | 3622.96 | 3.057 |

In summary, the present inventor has shown that if one converts a shaped pulse into an N+1 hard pulse sequence, with N sufficiently large so that each flip angle of the hard pulse sequence is small, then $a_N$, or the coefficient $e^{-iN\omega T}$ in the Fourier expansion of $\alpha(\omega)$ is proportional to the power (Equation 15). Therefore, in the design of a hard pulse sequence in accordance with the present invention, one specifies $\alpha(\omega)$ so that it is close to the desired frequency response, subject to the constraint that $\log(a_N)$ or $1-a_N$ is less than $(\pi^2 T^* E)/2N$, where E is the maximum total energy to be allowed for the pulse. Given such an $\alpha(\omega)$, an appropriate $\beta(\omega)$ can be synthesized, and a hard pulse sequence constructed which can be used as the basis for a shaped (soft) pulse. However, in accordance with the invention, the shaped pulse will have the designated maximum total energy and, as will be described more fully below, a reduced peak power.

Thus, the relationship between the Fourier transform of the frequency response of the pulse and the total energy of the pulse is encoded in the lowest Fourier coefficients of the frequency response. In particular, the total energy of the shaped pulse is encoded in one of the Fourier coefficients of $\alpha(\omega)$. This observation allows the pulse synthesis algorithm described in U.S. Pat. No. 5,153,515 to use the total energy of the pulse as a design parameter, further elucidating the complex relationship between an RF pulse and its frequency response. In other words, the problem of synthesizing reduced energy pulses is reduced to the problem of synthesizing a Fourier series whose frequency profile is close to a desired profile, subject to a constraint on one Fourier coefficient. Using the technique of the invention, reductions in energy of inversion pulses of the order of 10–20% have been achieved with minimal effects on the inversion profile. Further reductions are achievable with proportionately more effect on the inversion profile. For many rapid imaging schemes, this reduction in SAR per pulse can be highly significant.

Reduction of Peak Power

The above approach illustrates how to reduce the total energy required by the pulse. However, because of transmitter power limitations, it is often desirable to reduce the maximum power required by the RF pulse as well. The following description illustrates how this may be done.

As noted above, in order to synthesize the RF pulse with the desired frequency response, one has to specify the frequency response as a finite Fourier series. Typically, one specifies either $M_z(\omega)$, or equivalently $|\alpha(\omega)|^2$ or $|\beta(\omega)|^2$. One then constructs $\alpha(\omega)$ and $\beta(\omega)$ using a phase retrieval algorithm and then constructs the desired pulse. Because algorithms, using the cepstral transform, exist for rapidly obtaining the minimum and maximum phase solutions, such techniques may be readily used for calculating $\beta(\omega)$ as well as $\alpha(\omega)$. This approach has the additional advantage that if one specified a symmetric $M_z(\omega)M_z(-\omega)=M_z(\omega)$, one gets a constant phase pulse.

In accordance with the method of the invention, on the other hand, the basis for reducing the peak power of the pulse is the idea that using variable phase pulses may require less peak power than constant phase pulses because each frequency can be excited by a radio frequency pulse close to it. The pulse synthesis algorithm of U.S. Pat. No. 5,153,515 is thus modified. One starts, as in U.S. Pat. No. 5,153,515, by constructing a filter for $M_z(\omega)$, or equivalently, for $|\alpha(\omega)|^2$. The minimum phase solution for $\alpha(\omega)$ is then determined so that the total energy of the pulse is unchanged.

Where the present method differs is in the choice of $\beta(\omega)$. In accordance with the method of the invention, if an $\alpha(\omega)$ is specified which automatically specifies the total energy, then a $\beta(\omega)$ is synthesized which is compatible. If $\beta(\omega)$ is chosen such that it is not symmetric in $\omega$, the pulse synthesized will be a variable phase pulse. Since the maximum power requirements of a variable phase pulse are generally less than that of a constant phase pulse (because it can effect a frequency sweep), the peak power may be minimized by choosing a $\beta(\omega)$ which best approximates a frequency sweep. This is accomplished by appropriately selecting the roots for $\beta(\omega)$.

As noted in the U.S. Pat. No. 5,153,515, a phase retrieval algorithm may be used to solve for the roots of $|\beta(\omega)|^2$. These roots generally come in pairs $(z, 1/z^*)$ As described in that patent, each pair is ordered so that $|z| \geq 1$. For each pair, one chooses one element of the pair, $z_j$, and:

$$\beta(\omega) = c\, e^{\frac{-i\omega T}{2}} \prod_{j=1}^{N} e^{\frac{i\omega T}{N}} - z_j \qquad \text{Equation 16}$$

where c is a suitable normalizing constant. The result is a solution for $\beta(\cdot)$.

If $M_z(\omega)$ is symmetric (i.e., $M_z(\omega)=M_z(-\omega)$), then if z is a root, so is $z^*$. To obtain a constant phase pulse, whenever a root is chosen, its conjugate is also chosen. This will lead to a $\beta(\omega)$ with real coefficients in the expansion and a constant phase pulse. The cepstral deconvolution algorithm yields such constant phase pulses. However, in order to obtain reduced peak power pulses in accordance with the invention, a different root selection scheme for $\beta(\omega)$ is chosen. For each ordered pair, z is selected as the solution for $\beta(\omega)$ when the imaginary component of z is greater than or equal to 0; otherwise $1/z^*$ is chosen. On the other hand, z may be selected as a solution for $\beta(\omega)$ when the imaginary component of z is less than or equal to 0; otherwise $1/z^*$ is selected. Such selections of the roots of $\beta(\omega)$ lead to pulses with variable phase. Because the same $\alpha(\omega)$ is used, roughly the same total energy is used. Also, the larger the number of pulses used, the less change there is in the total energy.

Those skilled in the art will appreciate that unlike the minimum phase solution, the roots are not always outside the unit circle $|z|>1$. Those skilled in the art will also appreciate that minor modifications to the process may be made where a few roots are chosen by different criteria, so long as substantially similar results are yielded.

Figure 3:
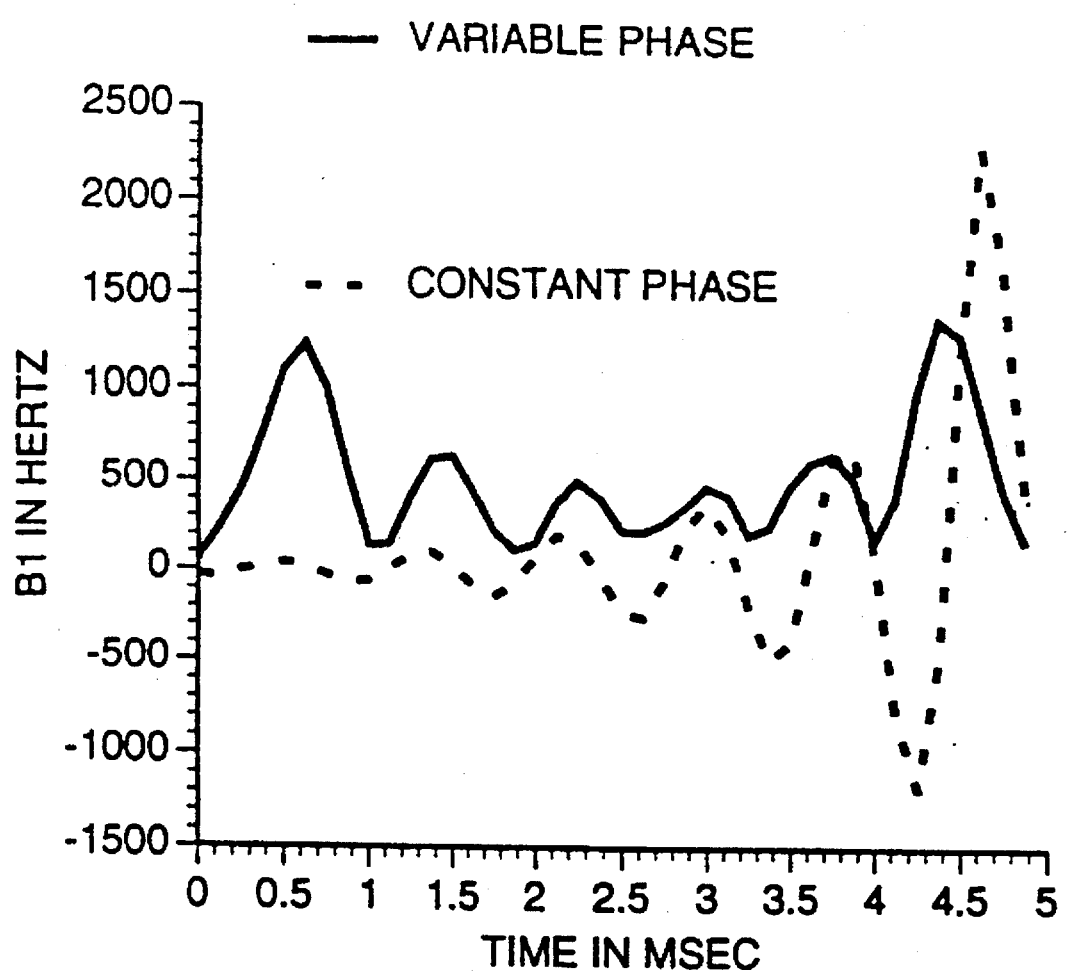
FIG. 3 illustrates the amplitude of a constant phase inversion pulse and of a reduced power, variable phase pulse produced in accordance with the invention. As illustrated, the energy $B_1$ of the variable phase pulse is reduced by 40% and the peak power by 64% compared to the constant phase pulse.
Figure 4:
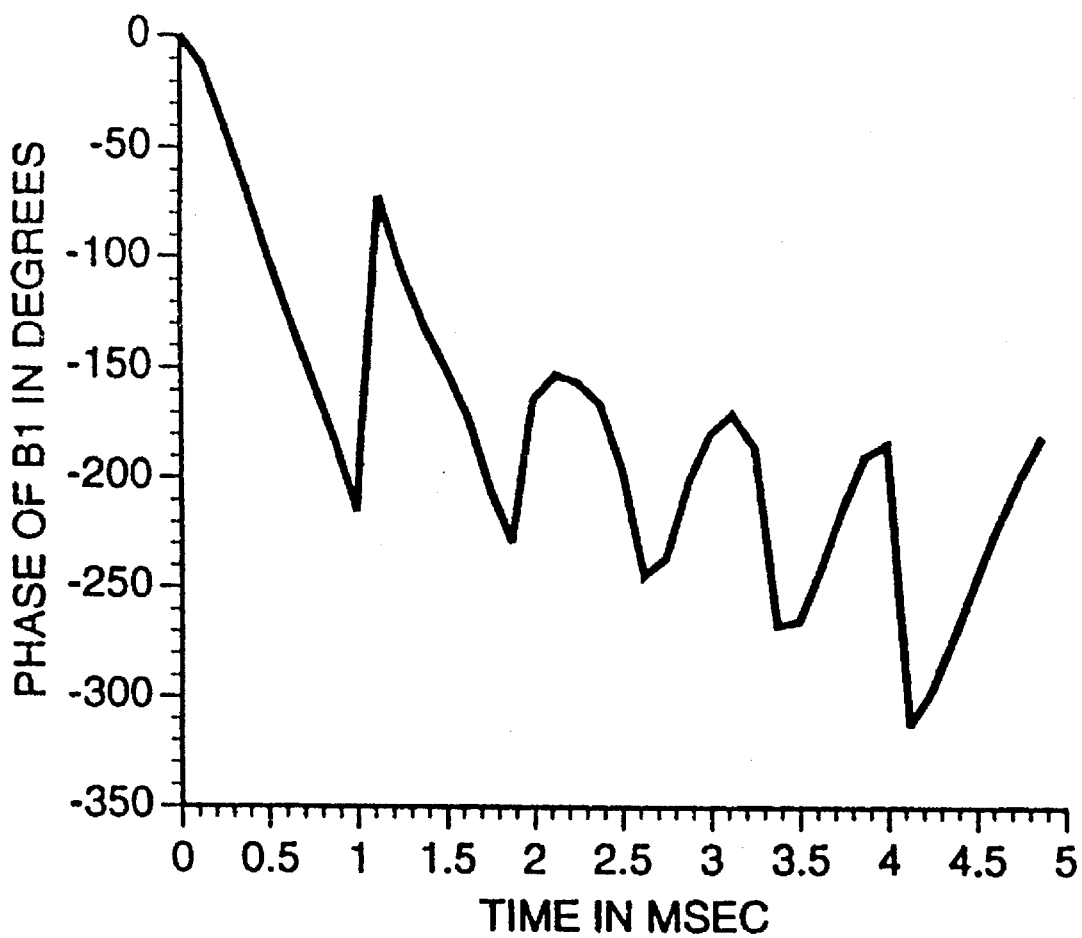
FIG. 4 illustrates the phase of the variable phase pulse of FIG. 3.
Figure 5:
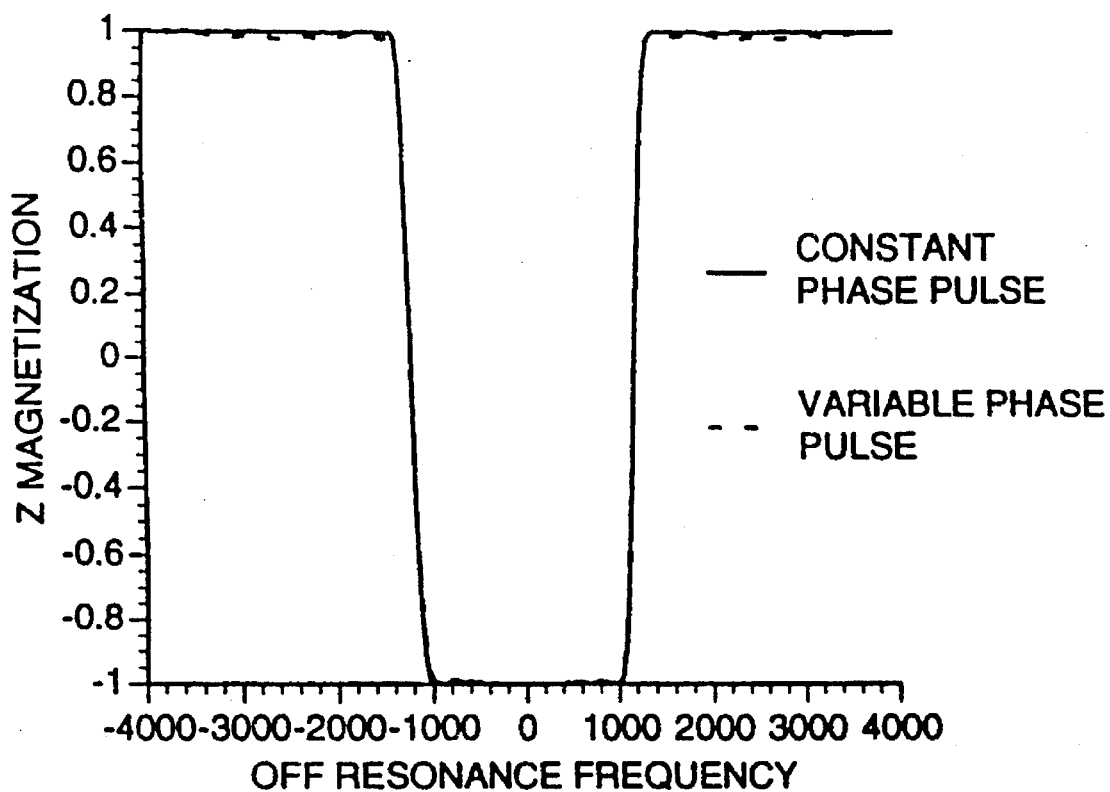
FIG. 5 illustrates a comparison of the conversion profiles in response to the constant phase pulse and the variable phase pulse. As illustrated, the inversion profiles are substantially identical.

The modified algorithm described herein has been applied to the synthesis of reduced power inversion and excitation pulses. As shown in FIG. 3, the $B_1$ amplitude (in Hz) for a constant phase pulse is reduced by the use of a reduced power, variable phase pulse in accordance with the invention. For example, in FIG. 3, the peak of $B_1$ is reduced from 2301 Hz for a constant phase inversion pulse to 1374 Hz for a reduced power, variable phase pulse. FIG. 4 illustrates the phase of the variable phase pulse of FIG. 3, where peak $B_1$ is reduced by 40% and the total energy by 64%. FIG. 5 illustrates a comparison of the inversion profiles of the resulting z magnetizations. As illustrated, the two curves are superimposable since they are substantially identical.

Thus, it is possible to reduce the peak power demands of a pulse by properly selecting the roots for $\beta(\omega)$, without any effect on the excitation or inversion profile, time of the pulse, or the total energy of the pulse sequence. Indeed, numerous constraints on the desired frequency response for the Fourier transform in such a response may be introduced in accordance with the invention in order to, for example, minimize the total energy of the pulse or to provide reduced peak powers. Peak power reductions on the order of 60–70% have been obtained using the techniques of the present invention.

Soft Pulses

As noted in U.S. Pat. No. 5,153,515, the frequency response of every soft pulse can be uniformly approximated on every bounded frequency range by hard pulse sequences. In other words, given a soft pulse lasting for time T, for a given N, the jth pulse of an N hard sequence lasting for time T can be constructed. As described therein, one can reverse the procedure by constructing the soft pulse from a given hard pulse sequence. That is, given an N hard pulse sequence lasting for time T, one can construct a soft pulse lasting for $T^*(N/(N-1))$. The soft pulse would have N segments, each lasting for a time $T/(N-1)$. During each segment, one applies a constant $B_1$ field which has the effect of rotating the 0 frequency spins the same amount as the hard pulses did.

If the flip angles of the hard pulses are relatively small, the frequency responses of the hard pulse sequence and the soft pulse, over a limited frequency range, are similar. As described in U.S. Pat. No. 5,153,515, the soft pulse with a similar frequency response to a hard pulse sequence may be formed from a hard pulse sequence by choosing a large number of pulses N for the hard pulse sequence and then choosing a hard pulse sequence which has relatively small flip angles. In order to get a hard pulse sequence with relatively small flip angles, one chooses the roots of $1-M_z^2$ which are used to construct $M_{xy}$ in accordance with the techniques described in U.S. Pat. No. 5,153,515.

In accordance with the invention, a reduced power soft pulse is generated by defining the spinor components of a pulse, $\alpha(\omega)$ and $\beta(\omega)$, and assuming that the pulse lasts for time T. Then, for a soft pulse, it can be shown that the Fourier transform of the $e^{\pi i \, \omega T} \alpha(\omega) = g(s)$ is 0 for s (the Fourier transform variable) as s approaches 0. In other words, the limit as s approaches 0 for g(s) is equal to $E^*\pi^2$, where E is the total energy of the soft pulse. Also, a(s) is zero for s<0 or s>T. Thus:

$$E = \lim_{S \to 0} \frac{a(S)}{\pi^2} \qquad \text{Equation 17}$$

On the other hand, for an infinite duration pulse, the pulse can be defined to be the limit of the pulse lasting from $-T$ to T, as T approaches infinity. The power of the pulse is the limit of the power of the finite duration pulses. Therefore, given the frequency response of the pulse, the power is encoded in the value of the Fourier transform of $\alpha(\omega)$ at a particular point.

Certain embodiments of the invention have been described in detail above which will provide methods of pulse generation for optimally exciting specified frequency bands with certain constraints on the input pulse. While preferred embodiments have been shown and described, modifications are within the spirit and scope of the invention and will be recognized by those with ordinary skill in the art. For example, the invention need not be implemented using spinors but may be represented using conventional nomenclature. Accordingly, all such modifications are intended to be included within the scope of the invention as defined by the following claims.

We claim:

1. A method of generating a desired physically realizable, frequency dependent excitation of a system having predetermined constraints on its frequency response, comprising the steps of:

(a) determining, as a function of frequency, an approximation to the desired frequency dependent excitation;

(b) specifying predetermined constraints on input pulses to the system which will yield the desired frequency dependent excitation, said predetermined constraints on the frequency response of said system including at least one of a maximum acceptable total energy for said input pulses and a reduction in maximum peak power of said input pulses which will still yield the desired frequency dependent excitation;

(c) synthesizing a hard pulse sequence of N pulses which generates said approximation and which satisfies said predetermined constraints on the input pulses; and (d) applying the hard pulse sequence of N pulses synthesized in step (c) to said system.

2. A method as in claim 1, wherein said system is a nuclear magnetic resonance imaging system and said hard pulse sequence of N pulses is used to form an imaging slice for display.

3. A method as in claim 2, wherein said desired frequency dependent excitation is a magnetization applied to said system when said system is in an external magnetic field.

4. A method as in claim 3, wherein said desired frequency dependent excitation includes a rotation operator applied to said system when said system is in said external magnetic field and the synthesized hard pulse sequence of N pulses is used to refocus said imaging slice for display.

5. A method as in claim 1, wherein said synthesizing step (c) comprises the step of determining constraints of a pulse profile of said approximation which yield said desired frequency dependent excitation yet satisfy said predetermined constraints on the input pulses to said system.

6. A method as in claim 1, wherein said determining step (a) comprises the step of determining, as a function of frequency ω, an approximation to a desired physically realizable magnetization $M_z$ in a direction z parallel to an external magnetic field B for the desired frequency dependent excitation of said system.

7. A method as in claim 1, wherein said desired frequency dependent excitation is described by a spinor of the form $(\alpha(\omega), \beta(\omega))$ where $M_z(\omega) = |\alpha(\omega)|^2 - |\beta(\omega)|^2$, and where $$\alpha(\omega) = \sum_{j=0}^{N} a_{N-2j} e^{\frac{i\pi(N-2j)\omega T}{N}}$$

and where $$\beta(\omega) = \sum_{j=0}^{N} b_{N-2j} e^{\frac{i\pi(N-2j)\omega T}{N}}$$

where a and b are coefficients of said hard pulse sequence of N pulses and T is a time duration of said hard pulse sequence of N pulses.

8. A method as in claim 7, wherein the maximum acceptable total energy $$E = \int_{0}^{T} |\omega_1|^2 dt$$

for said hard pulse sequence of N pulses applied to said system is proportional to a Fourier coefficient for α, where said Fourier coefficient is defined as:

$$\frac{2N(1 - a_N)}{\pi^2 T}.$$

9. A method as in claim 8, wherein said synthesizing step (c) comprises the step of synthesizing α(ω) using a minimum phase solution so that it is close to the desired frequency dependent excitation, said step of synthesizing α(ω) being subject to the constraint that $1-a_N < (\pi^2 T^* E)/2N$, where E is the maximum acceptable total energy allowed for said hard pulse sequence of N pulses.

10. A method as in claim 9, wherein said synthesizing step (c) comprises the step of solving for the roots of $\beta(\omega)^2$, where $|\beta(\omega)|^2 = 1 - |\alpha(\omega)|^2 = (1-M_z(\omega))/2$, placing the roots of $|\beta(\omega)|^2$ in ordered pairs (z, 1/z*), where $|z| \geq 1$, and then either selecting z as a solution for β(ω) when $z_{imaginary} \geq 0$, selecting 1/z* as a solution for β(ω) when $z_{imaginary} < 0$, selecting z as a solution for β(ω) when the $z_{imaginary} = < 0$ or selecting 1/z* as a solution for β(ω) when $z_{imaginary} > 0$.

11. A method of generating a desired physically realizable, frequency dependent excitation of a system by applying a hard pulse sequence of N pulses, said hard pulse sequence having a predetermined maximum total energy during a duration T of said hard pulse sequence and said hard pulse sequence having a peak power which is reduced from the peak power which results when a minimum phase solution to a determination of the roots of β(ω) is used in calculation of a desired frequency dependent magnetization $M_z$, said method comprising the steps of:

(a) determining, as a function of frequency ω, an approximation to the desired frequency dependent magnetization $M_z$ in a direction z parallel to an external magnetic field B for the desired frequency dependent excitation of said system, where $|M_z|^2 = |\alpha|^2 - |\beta|^2$;

(b) selecting roots for α which minimize the total energy of said hard pulse sequence during said duration T and roots for β which minimize the peak power of each pulse of said hard pulse sequence during said duration T;

(c) synthesizing the hard pulse sequence of N pulses which generates the approximation for $M_z$ having the roots for α and β selected in step (b); and (d) applying the hard pulse sequence of N pulses synthesized in step (c) to said system.

12. A method as in claim 11, wherein the predetermined maximum total energy $$E = \int_{0}^{T} |\omega_1|^2 dt$$

for said hard pulse sequence of N pulses applied to said system is proportional to a Fourier coefficient for α, where said Fourier coefficient is defined as:

$$\frac{2N(1 - a_N)}{\pi^2 T}.$$

13. A method as in claim 12, wherein said selecting step (b) comprises the step of synthesizing α(ω) using a minimum phase solution so that it is close to the desired frequency dependent excitation, said step of synthesizing α(ω) being subject to the constraint that $1-a_N < (\pi^2 T^* E)/2N$, where E is the predetermined maximum total energy allowed for said hard pulse sequence of N pulses.

14. A method as in claim 13, wherein said synthesizing step (c) comprises the step of solving for the roots of $\beta(\omega)^2$, where $|\beta(\omega)|^2 = 1 - |\alpha(\omega)|^2 = (1-M_z(\omega))/2$, placing the roots of $|\beta(\omega)|^2$ in ordered pairs (z, 1/z*), where $|z| \geq 1$, and then either selecting z as a solution for β(ω) when $z_{imaginary} \geq 0$, selecting 1/z* as a solution for β(ω) when $z_{imaginary} < 0$ selecting 1 as a solution for β(ω) when the $z_{imaginary} = < 0$ or selecting 1/z* as a solution for β(ω) when $z_{imaginary} > 0$.

15. A method of generating a desired physically realizable, frequency dependent excitation of a system by applying a hard pulse sequence of N pulses, said hard pulse sequence having a predetermined maximum total energy during a duration T of said hard pulse sequence and said hard pulse sequence having a peak power which is reduced from the peak power which results when a minimum phase solution to a determination of the roots of β(ω) is used in calculation of a desired frequency dependent magnetization $M_z$, said method comprising the steps of:

(a) determining, as a function of frequency ω, an approximation to the desired frequency dependent magnetization $M_z$ in a direction z parallel to an external magnetic field B for the desired frequency dependent excitation of said system;

(b) specifying said predetermined maximum total energy and a desired reduction in peak power for the desired frequency dependent excitation;

(c) synthesizing from $M_z(\omega)$, said predetermined maximum total energy, and the desired reduction in peak power the hard pulse sequence of N pulses which generates the approximation for $M_z$ determined in step (a), said hard pulse sequence of N pulses having a total energy no greater than said predetermined maximum total energy and each pulse of said pulse sequence having a peak power reduced from the peak power which results when the minimum phase pulse solution to the determination of the roots of $\alpha(\omega)$ is used in calculation of the desired frequency dependent magnetization $M_z$; and (d) applying the hard pulse sequence of N pulses synthesized in step (c) to said system.

16. A method as in claim 15, wherein said synthesizing step (c) comprises the step of solving for the roots of $\beta(\omega)^2$, where $|\beta(\omega)|^2 = 1 - |\alpha(\omega)|^2 = (1 - M_z(\omega))/2$, placing the roots of $|\beta(\omega)|^2$ in ordered pairs $(z, 1/z^*)$, where $|z| >= 1$ and then either selecting z as a solution for $\beta(\omega)$ when $z_{imaginary} >= 0$, selecting $1/z^*$ as a solution for $\beta(\omega)$ when $z_{imaginary} < 0$, selecting z as a solution for $\beta(\omega)$ when the $z_{imaginary} = <0$ or selecting $1/z^*$ as a solution for $\beta(\omega)$ when $z_{imaginary} > 0$.

17. A method of generating a desired physically realizable, frequency dependent excitation of a system having predetermined constraints on its frequency response, comprising the steps of:

(a) determining, as a function of frequency, an approximation to the desired frequency dependent excitation;

(b) specifying predetermined constraints on input pulses to the system which will yield the desired frequency dependent excitation, said predetermined constraints on the frequency response of said system including at least one of a maximum acceptable total energy for said soft pulse and a reduction in maximum peak power of said soft pulse which will still yield the desired frequency dependent excitation;

(c) synthesizing a hard pulse sequence of N pulses which generates said approximation and which satisfies said predetermined constraints on the input pulses;

(d) synthesizing from said hard pulse sequence of N pulses a soft pulse which causes a frequency dependent excitation of said system substantially corresponding to the frequency dependent excitation of said system when said hard pulse sequence of N pulses is applied; and (e) applying the soft pulse synthesized in step (d) to said system.

18. A method as in claim 17, wherein said system is a nuclear magnetic resonance imaging system and said soft pulse is used to form an imaging slice for display.

19. A method as in claim 18, wherein said desired frequency dependent excitation is a magnetization applied to said system when said system is in an external magnetic field.

20. A method as in claim 19, wherein said desired frequency dependent excitation includes a rotation operator applied to said system when said system is in said external magnetic field and the synthesized soft pulse is used to refocus said imaging slice for display.

21. A method as in claim 17, wherein said synthesizing step (c) comprises the step of determining constraints of a pulse profile of said approximation which yield said desired frequency dependent excitation yet satisfy said predetermined constraints on the input pulses to said system.

22. A method as in claim 17, wherein said determining step (a) comprises the step of determining, as a function of frequency $\omega$, an approximation to a desired physically realizable magnetization $M_z$ in a direction z parallel to an external magnetic field B for the desired frequency dependent excitation of said system.

23. A method as in claim 17, wherein said desired frequency dependent excitation is described by a spinor of the form $(\alpha(\omega), \beta(\omega))$, where $M_z(\omega) = |\alpha(\omega)|^2 - |\beta(\omega)|^2$, and where $$\alpha(\omega) = \sum_{j=0}^{N} a_{N-2j} e^{\frac{i\pi(N-2j)\omega T}{N}}$$

and where $$\beta(\omega) = \sum_{j=0}^{N} b_{N-2j} e^{\frac{i\pi(N-2j)\omega T}{N}}$$

where a and b are coefficients of said hard pulse sequence of N pulses and T is a time duration of said hard pulse sequence of N pulses.

24. A method as in claim 23, wherein the maximum acceptable total energy $$E = \int_O^T |\omega_1|^2 dt$$

for said hard pulse sequence of N pulses applied to said system is proportional to a Fourier coefficient for $\alpha$, where said Fourier coefficient is defined as:

$$\frac{2N(1 - a_N)}{\pi^2 T}.$$

25. A method as in claim 24, wherein said synthesizing step (c) comprises the step of synthesizing $\alpha(\omega)$ using a minimum phase solution so that it is close to the desired frequency dependent excitation, said step of synthesizing $\alpha(\omega)$ being subject to the constraint that $1 - a_N < (\pi^2 T * E)/2N$, where E is the maximum acceptable total energy allowed for said soft pulse.

26. A method as in claim 25, wherein said synthesizing step (c) comprises the step of solving for the roots of $\beta(\omega)^2$, where $|\beta(\omega)|^2 = 1 - |\alpha(\omega)|^2 = (1 - M_z(\omega))/2$, placing the roots of $|\beta(\omega)|^2$ in ordered pairs $(z, 1/z^*)$, where $|z| >= 1$, and then either selecting z as a solution for $\beta(\omega)$ when $z_{imaginary} >= 0$, selecting $1/z^*$ as a solution for $\beta(\omega)$ when $z_{imaginary} < 0$, selecting z as a solution for $\beta(\omega)$ when the $z_{imaginary} = <0$ or selecting $1/z^*$ as a solution for $\beta(\omega)$ when $z_{imaginary} > 0$.

* * * * *